(12) United States Patent
Chan et al.

(10) Patent No.: US 7,082,595 B1
(45) Date of Patent: Jul. 25, 2006

(54) SCHEMATIC DRIVEN PLACEMENT METHOD AND PROGRAM PRODUCT FOR CUSTOM VLSI CIRCUIT DESIGN

(75) Inventors: Yiu-Hing Chan, Poughkeepsie, NY (US); Jonathan Chu, Poughkeepsie, NY (US); George D. Gristede, Katonah, NY (US); Gregory A. Northrop, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/055,905

(22) Filed: Feb. 11, 2005

(51) Int. Cl.
*G06F 17/50* (2006.01)

(52) U.S. Cl. .................. 716/18; 716/8; 716/9; 716/10

(58) Field of Classification Search ............... 716/18, 716/8, 9, 10
See application file for complete search history.

(56) References Cited

U.S. PATENT DOCUMENTS

| 5,768,479 | A | * | 6/1998 | Gadelkarim et al. | .......... 706/52 |
| 5,872,952 | A | * | 2/1999 | Tuan et al. | .................. 703/14 |
| 6,496,715 | B1 | * | 12/2002 | Lee et al. | .................. 600/424 |
| 2005/0028113 | A1 | * | 2/2005 | Lin et al. | ...................... 716/3 |

* cited by examiner

*Primary Examiner*—Sun James Lin
(74) *Attorney, Agent, or Firm*—Lynn L. Augspurger; Richard M. Goldman

(57) ABSTRACT

A physical device layout tool and method. The method and tool receive a user provided schematic with circuit data and placement parameters, including defaults. Further inputs include a definition of cell physical position in the horizontal direction, a definition of the cell's vertical stacking level, a definition of the cell orientation, a specification of vertical alignment of multiple cell instances, and a definition of vertical spacing between 2 adjacent cell instances. These input parameters are used to generate a layout with the placed circuit elements.

4 Claims, 6 Drawing Sheets

SCHEMATIC DRIVEN PLACEMENT METHOD AND PROGRAM PRODUCT FOR CUSTOM VLSI CIRCUIT DESIGN

BACKGROUND

1. Field of the Invention

The invention relates to methods and tools for device placement in custom designed VLSI circuits, and especially to schematic driven placement method for custom VLSI circuit design, thereby enabling fast prototyping of layout with placed VLSI circuits for area and size estimation and routing.

2. Background Art

Generally in custom VLSI circuit design the placement of circuits in the layout is done after the schematic is completely done. Circuit placements in custom design are done either graphically or through a unique placement routine for each design, i.e., a Cadence Skillcode based routine. If the circuits placement is done graphically, it usually takes designer some effort to make the placement ground rule correct. If there is any update on either the device size or topology in the schematic, the placement in the layout has to be redone manually. Area, size and form factor of the design are estimated based on the floorplan, total device width in the schematic, and projected wiring tracks required to route the design. Skill code driven placement usually requires customized functions and hard coded instance names, thus demanding distinct coding efforts for each macro placed. This provides limited scalability, and extensibility, and makes entry of engineering changes difficult.

SUMMARY OF INVENTION

According to our invention, there is provided a physical device layout tool and method. According to the invention a user provides a schematic with circuit data. The tool and method have as their inputs a definition of cell physical position in the horizontal direction, a definition of the cell's vertical stacking level, a definition of the cell orientation, a specification of vertical alignment of multiple cell instances, and a definition of vertical spacing between two adjacent cell instances.

The method and tool use these input parameters to decode the placement parameters and definitions and calculate absolute placement coordinates and thereby generate a layout with the placed circuit elements.

The advantages of the invention include, among other things:

1) The learning effort required by the user to use these five parameters for encoding placement information in the schematic is very small. When compared to iterative manual placement of instances graphically or writing unique functions to place instances in the layout for each design, schematic driven placement is significantly faster.

2) The absolute values of the width of each physical bit position and the PC (polygate channel) pitch depend upon the technology and the library cells that are used in the design. The coordinates are generated by the placement routine, and are thus dynamically adaptable to technology migration. The parameters of a given technology/methodology can be changed in the program in order to adapt to a new project environment. This enables migration of the schematic and placed layout designed from one technology to another technology or from one cell library to another cell library by updating the parameters within the placement routine and re-processing a layout with it.

3) Since the library cells are designed with fixed X dimensions and variable Y dimensions, and the value of the Y level instance parameter is relative, any vertical Y dimension changes of an instance, for example, due to device re-sizing for performance tuning or logic changes for functional reasons, can be easily regenerated. This process saves on time consuming manual movement of the instances in the layout to remove overlaps and allows the regeneration of the placement in a matter of seconds.

4) The layout with placed instances of circuits reflects the actual size and form factor of the final design. This leads to more accurate area/form factor estimation of all the macro designs early in the design phase and allows for more accurate floorplanning in the next level of the chip design, such as unit level which is made up of macros. Sizing and wiring constraints and conflicts are more easily exposed with this method and are captured earlier in the design process.

5) The method in which the parameters are defined allow for quick and simple, yet powerful descriptions of placements. An array of instances can be defined with a pattern, enabling the designer to produce a quick placement regardless of the number of instances in the array. In the past, the time spent on placement increased linearly with the number of instances to be placed.

6) With the advent of computer scripting, errors and omissions in layout are easily caught and screened by the user. The program warns the user of overlaps and missing instances before routing begins.

7) Computer scripting also traverses schematic hierarchy to place instances across all levels of the design. This automation saves on manual effort of users repeatedly executing the same procedure on all schematics in different levels of the hierarchy.

THE FIGURES

Various embodiments and exemplifications of our invention are illustrated in the Figures appended hereto.

DETAILED DESCRIPTION

Figure 1:
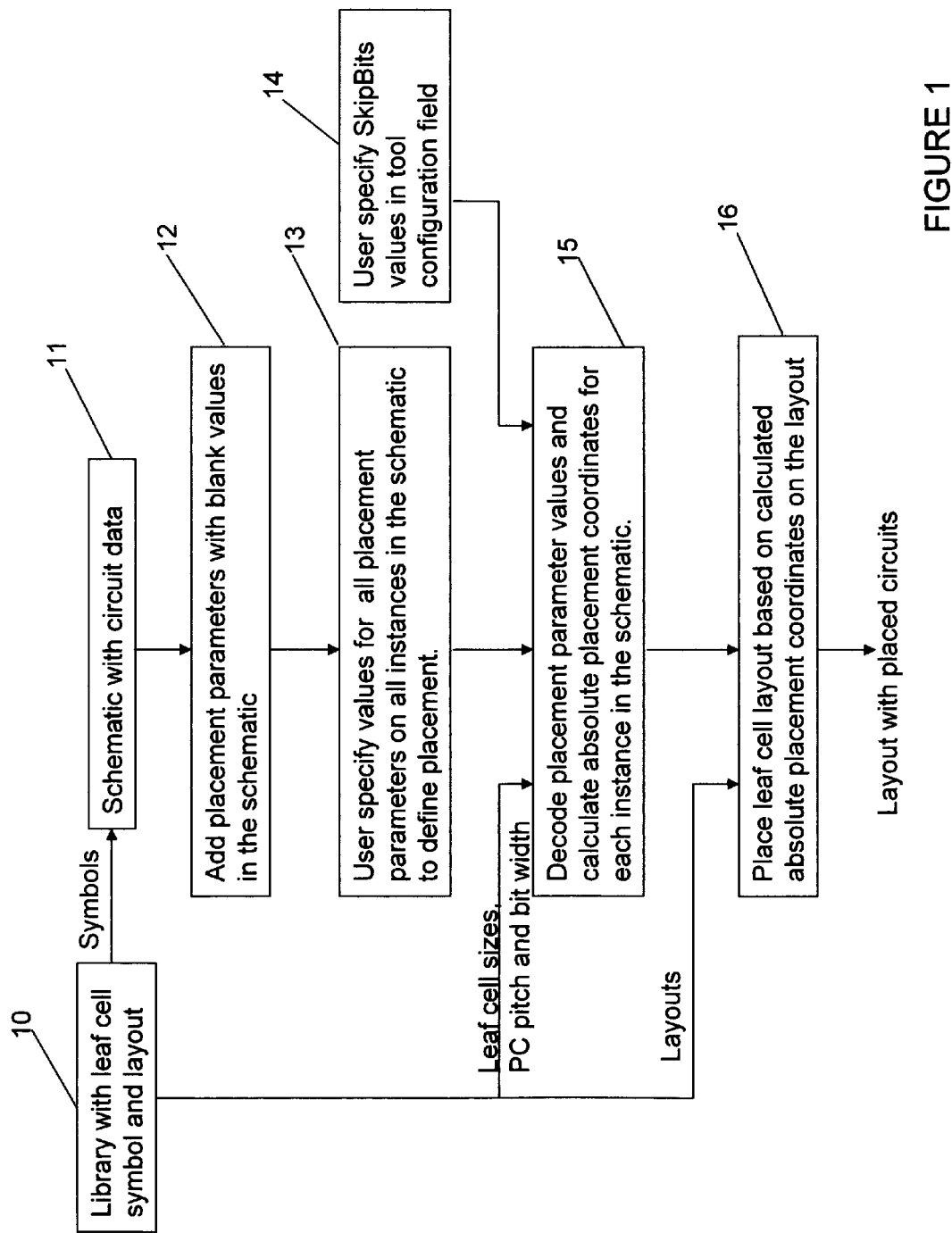
FIG. 1 is a high level symbolic flowchart of the method and tool of our invention.

The invention describes a method of encoding shorthand relative placement information within a schematic. Five parameters are placed onto the schematic instance symbols and describe the placement of the instances. These five placement parameters include a definition of cell physical position in the horizontal direction, a definition of the cell's vertical stacking level, a definition of the cell orientation, a specification of vertical alignment of multiple cell instances, and a definition of vertical spacing between two adjacent cell instances. The five parameters can describe any placement topology desired by the user and represent a relative placement of each cell. In this way, layouts can be easily adjusted if subcells change size.

A generalized code routine interprets and processes the parameters to generate a placed layout view. As the parameters are structured and regular across all designs, the same code is re-used for every macro placed.

Before describing various aspects of the invention in greater detail, the following definitions are provided to facilitate an understanding of the invention:

Schematic—electric drawing of a circuit.

VLSI Circuit Hierarchy—a very large scale integrated (VLSI) circuit hierarchy comprises various level of functional circuit units. As an example, a VLSI circuit may comprise units, with each unit comprising macros. A macro may comprise one or more sub-macros, and a sub-macro one or more gate/cells. A gate/cell may comprise one or more transistors/devices. Examples of units include a floating point unit, and an instruction fetch unit. Example of macros include a 32-bit parallel adder, and a 32-bit register. Example of sub-macro include clock drivers, latches, and 4-bit ripple carry adders. Example of gate/cells are 2 input NAND, and 3 input NOR devices, etc.

Library—a design database which contains the symbol, schematic and layout of all the macros, submacros and leaf cells/gates to be used for a design.

Floorplan—a graphical drawing which indicates location, size and form factor of certain level of a VLSI circuit hierarchy. A floorplan is a precursor to a layout.

Circuit Layout—a graphical drawing which indicates location, size and form factors of objects. The detailed shapes of the objects represent different manufacturing layers of the semi-conductor process, i.e., polygate channel, metal layers for interconnecting objects, P+ diffusion area of a transistor, N+ diffusion area of a transistor, etc. A completely placed, routed and checked circuit layout is used for manufacturing of the VLSI circuit/chip.

Placed Layout—a graphical drawing which indicates locations of any submacro/gate/cells. A placed layout is similar to a circuit layout but it does not contain any interconnect/route between submacro/gate/cells.

Ground Rules—Spacing and width design specification for shapes in the layout which define the geometry of different layers of a semi-conductor process.

prBoundary—a shape in a layout which outlines the perimeter of the layout. All the shapes inside the prBoundary is half a design ground rule from the edge of the prBoundary shape such that when instances of different layouts are placed abut they are all ground rule correct.

The five parameters for describing instance placement information are fipBit for definition of physical horizontal position, fipYlevel for definition of relative stacking level, fipRot for definition of cell orientation, fipSnap for defining vertical alignment of multiple instances, and fipPcskip for definition of vertical spacing between two adjacent instances. They are illustrated and defined as follows:

1. fipBit—fipbit defines the physical horizontal position in the layout. Each physical position is x um in width and corresponds to the standard width of the cell library for the technology in use. The value of x is stored as value of a parameter in the program that processes the encoded placement information from the schematic and generates the layout with placed instances. In general the horizontal placement coordinates of an instance is calculated by multiplying x um with the fipbit value of the instance.

2. fipYlevel—fipYlevel defines the relative vertical stacking level of an instance. The instance with the lowest value for fipYlevel is placed at the lower origin of the layout grid (usually on the x-axis). Each instance with a higher fipYlevel then stacks on top of this instance in order of lowest to highest. The prBoundaries of these instances abut by default ensuring the layout is compacted as efficiently as possible.

3. fipRot—fipRot defines the orientation of the cell. It controls any rotation or mirroring of the cell to be placed. It can be used to help optimize routing.

4. fipSnap—fipSnap allows the user to align multiple instances on vertical location. It is useful for dataflow macros where an array of muxes or registers need to be snapped to the same elevation. All instances with fipSnap turned on will have a y location equal to the highest snap line beneath it.

5. fipPcskip—fipPcskip defines how many PC (device polygate channel) pitches is skipped vertically before an instance is placed on its fipYlevel stacking position. This property allows the designer to make manual adjustments after the placement algorithms are finished.

Usually the placements of an array of instances occur in a recurring pattern. The instance parameter notation allows for a quick hand description of arrayed instances, such that a bank of cells does not have to be manually described. For example, when a user adds three periods, i.e., ". . . " to a fipBit, fipYlevel, or fipSnap parameter the tool extrapolates the numerical differential between integers in the parameter and generates projected values, which are repeated until the entire array of instances are placed. The values of all these instance parameters from the schematic are processed through a program which decodes this information, calculates the absolute (x, y) placement coordinates of each instance, and places the instances of the circuit in a layout.

In the tool, there is a configuration field called Skip Bits which allow user to define bit positions to be skipped over during placement of an array of instances with patterns defined by the three periods notation. For example, a register is made up of an array of latches and one or more clock drivers. The clock drivers usually need to be placed in between the latches. By defining the positions where the clock drivers are placed as values of the Skip Bits, the array of latches can be specified with simple fipBit values and the entire array of latches will be placed horizontally across the dataflow accordingly and skipped over the Skip Bits positions where the clock drivers are.

For a macro schematic with more than two levels of hierarchy, the tool will traverse the schematic hierarchy and generate placed layout for the lowest level of the hierarchy first, then continue to the level one higher than the lowest level and so on until all placed layouts for every levels of the schematic hierarchy are generated.

FIG. 1 is a high level symbolic flowchart of the method and tool of our invention. As illustrated in FIG. 1, a schematic is provided with circuit data 11. The user runs the tool of our invention to add the five placement parameters: two with blank values and three with default values to all the instances in the schematic 12. The user then specifies values for each placement parameters on all the instances in the schematic to define placement for all the instances in the schematic based on a perceived floorplan. This results in a schematic with the circuit data and instance placement information 13. In conjunction, the user also has the option to specify values for Skip Bits in the tool's configuration field to define any bit position to skip over during the calculation of the absolute coordinates for the placement locations of an array of instances 14. The tool obtains the submacro or leaf cell sizes, PC pitch and bit width information from the library, reads the Skip Bits values from the tool configuration field, decodes the placement parameter values from all the instances in the schematic, and calculates the absolute placement coordinates for all the instances in the schematic 15. The tool then places the submacro or leaf cell layout of all the instances according to the calculated absolute coordinates for each instance on the layout 16.

Figure 2:
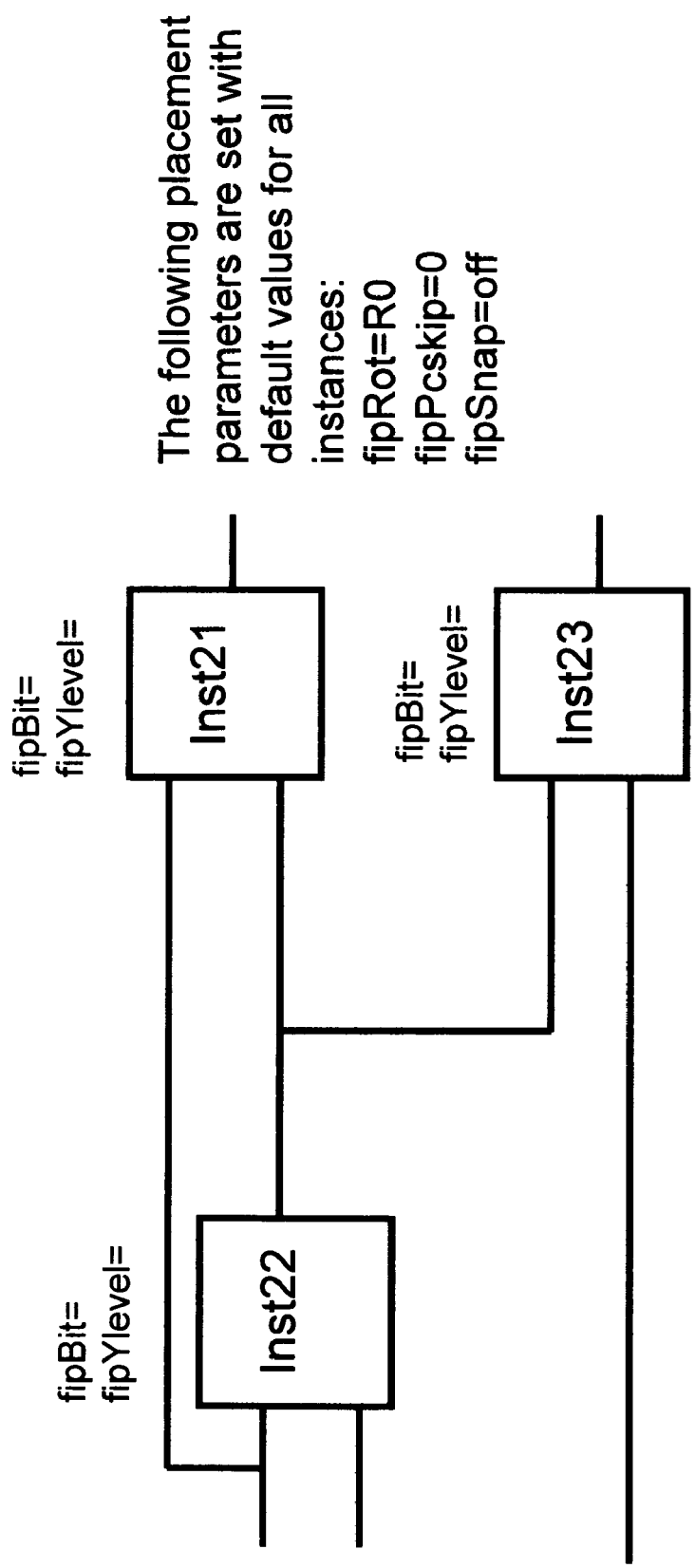
FIG. 2 is a circuit schematic with blank values for two of the five placement parameters and default values for the other three placement parameters added to the three instances in the schematic according to the tool and method described herein.

FIG. 2 is a representation of a schematic with the five placement parameters added by the tool on Inst21, Inst22 and Inst23 as described in 12 of FIG. 1. Two of these five placement parameters, i.e., fipBit and figYlevel, have blank values and the other three placement parameters, i.e., fipRot, fipPcskip and fipSnap have default values of R0 (no rotation), 0 (no vertical spacing between adjacent instances) and off (does not follow snap rule) which reflects the most often used values.

Figure 3:
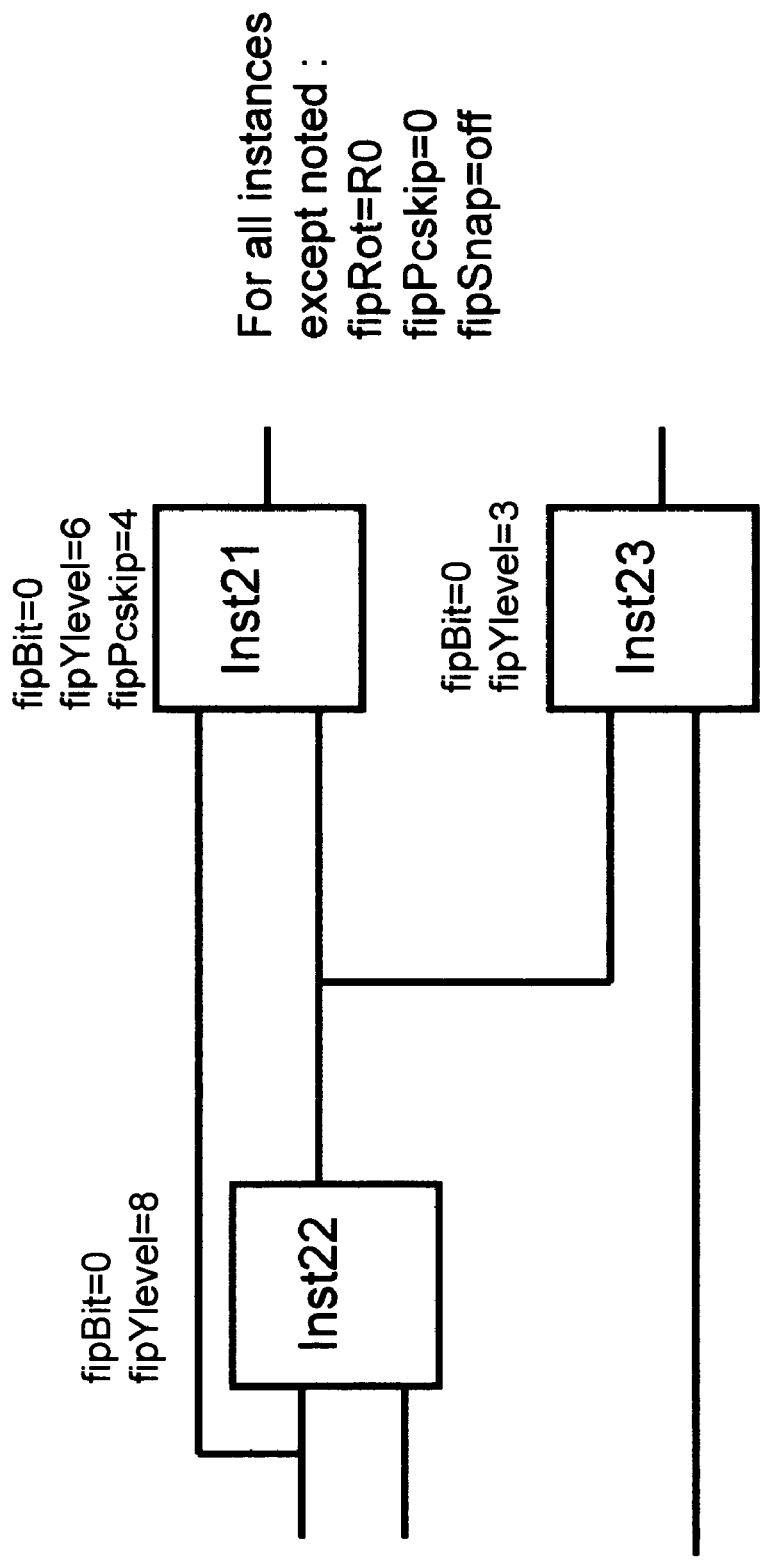
FIG. 3 is a circuit schematic with user specified values for the five placement parameters to define placement for the three instances in the schematic according to the tool and method described herein.

FIG. 3 is a representation of a schematic with values specified for the five placement parameters by the user to define placement of the three instances, i.e., Inst21, Inst22 and Inst23, in the schematic as described in 13 of FIG. 1. The values for these placement parameters are based on a perceived floorplan. In this example, the floorplan indicates that all three instances, i.e., Inst21, Inst22 and Inst23 are vertically stacked in bit position 0 so the user specifies fipBit=0 for the three instances. The floorplan also indicates Inst23 is placed at the origin (0, 0), Inst21 is above Inst23 with spacing equal to 4 PC pitches, and Inst22 is placed above Inst21. The user specifies arbitrary value for fipYlevel for Inst21, Inst22 and Inst23 such that Inst23 is below Inst21 which is below Inst22. The user chooses 6, 8, and 3 respectively for Inst21, Inst22 and Inst23. To specify a vertical spacing of 4 PC pitches between Inst21 and Inst23, the user specifies a value of 4 for Inst21 fipPcskip.

Figure 4:
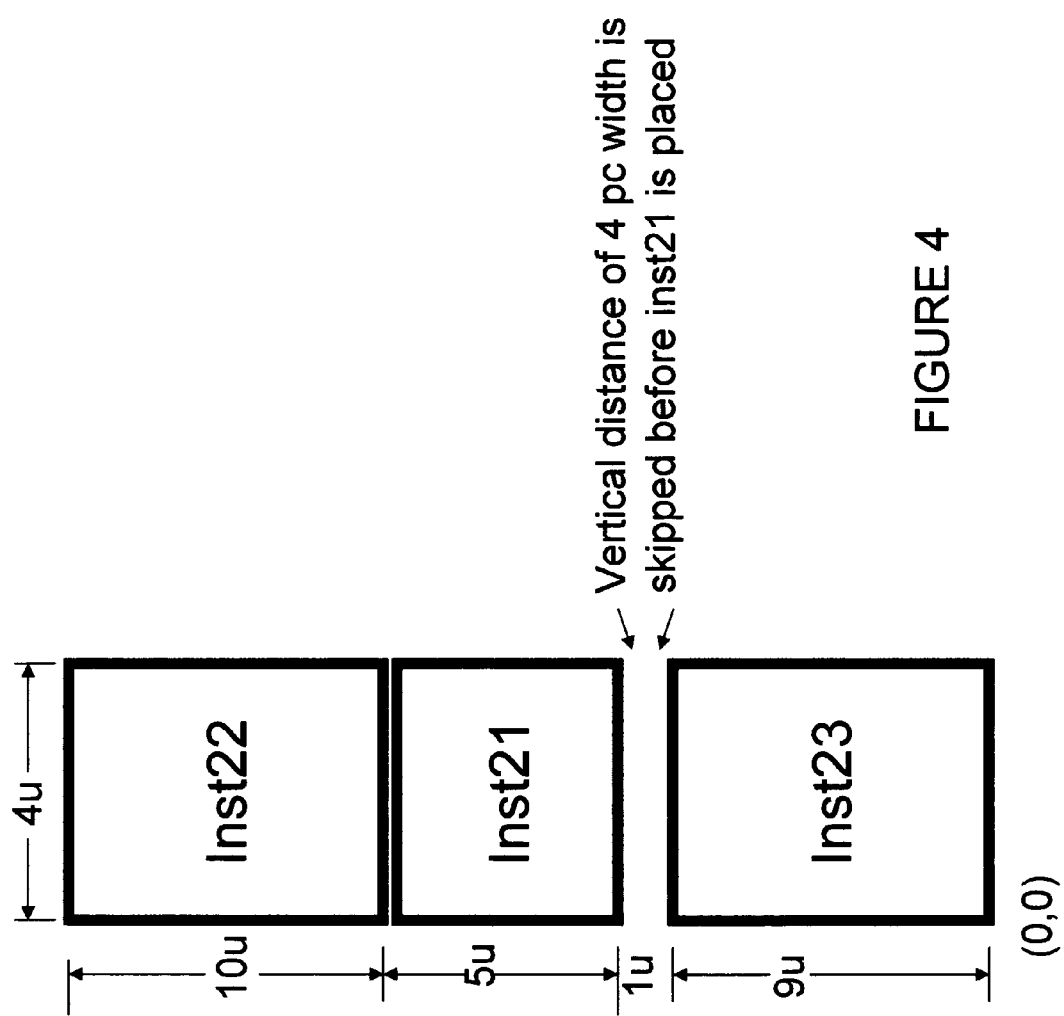
FIG. 4 is a layout with placed circuits generated from the circuit schematic in FIG. 3 according to the tool and method described herein.

FIG. 4 is a representation of a layout with placed circuit elements generated by the tool after processing the schematic in FIG. 3 through the program as described in 15 and 16 of FIG. 1. The tool obtains the size of each instance from the library of the leaf cells. For this example, the sizes for Inst21, Inst22 and Inst23 are x=4u, y=5u; x=4u, y=10u; and x=4u, y=9u. The tool then decodes the values of the placement parameters of each instance in the schematic, calculates the absolute placement coordinates for each instance in the schematic and then places the leaf cells in a layout according to the calculated absolute coordinates for each instance. In this example, the bit width is 4u; the PC pitch is 0.25u and the calculated absolute placement coordinates for Inst21, Inst22 and Inst23 are (0, 10), (0, 15) and (0, 0). All three instances are placed according to the calculated coordinates in the layout. This illustrates the relative placement nature of the tool since the fipYlevel values of the three instances are not consecutive.

Figure 5:
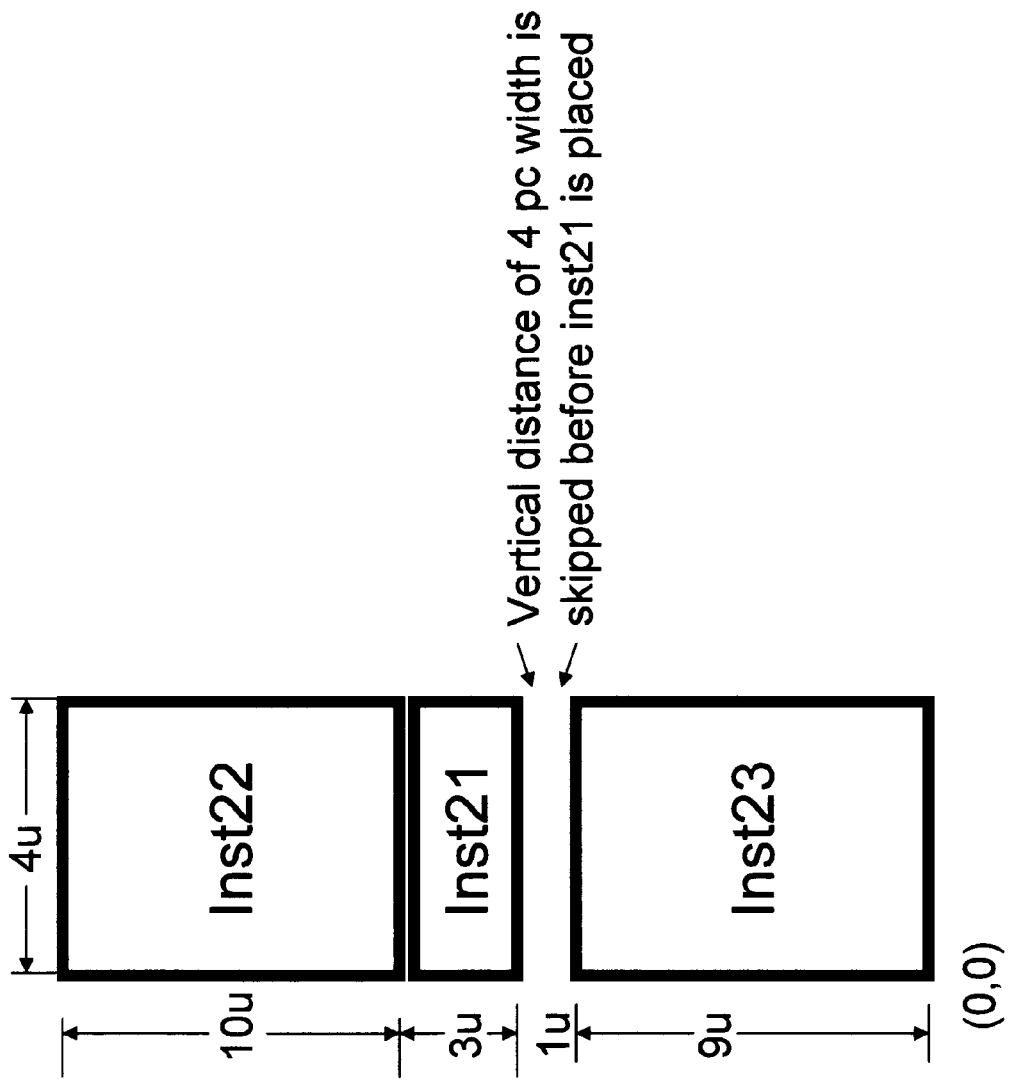
FIG. 5 is a layout with placed circuits re-generated from the circuit schematic in FIG. 3 after Inst21 is resized according to the tool and method described herein.

FIG. 5 is a representation of a layout with placed circuit elements generated by the tool after reprocessing the schematic in FIG. 3 as described in 15 and 16 of FIG. 1 due to a size change on Inst21. The size of Inst21 changed from x=4u, y=5u to x=4u, y=3u. The schematic can be processed through the tool again so that the absolute placement coordinates can be re-calculated. In this case, the new placement coordinates for Inst21, Inst22 and Inst23 are (0, 10), (0, 13) and (0, 0). This illustrates that if there are changes in vertical dimension of any submacro, leaf cells or gates, the layout with placed circuit instances can be regenerated easily and quickly by reprocessing the schematic through the tool.

Figure 6:
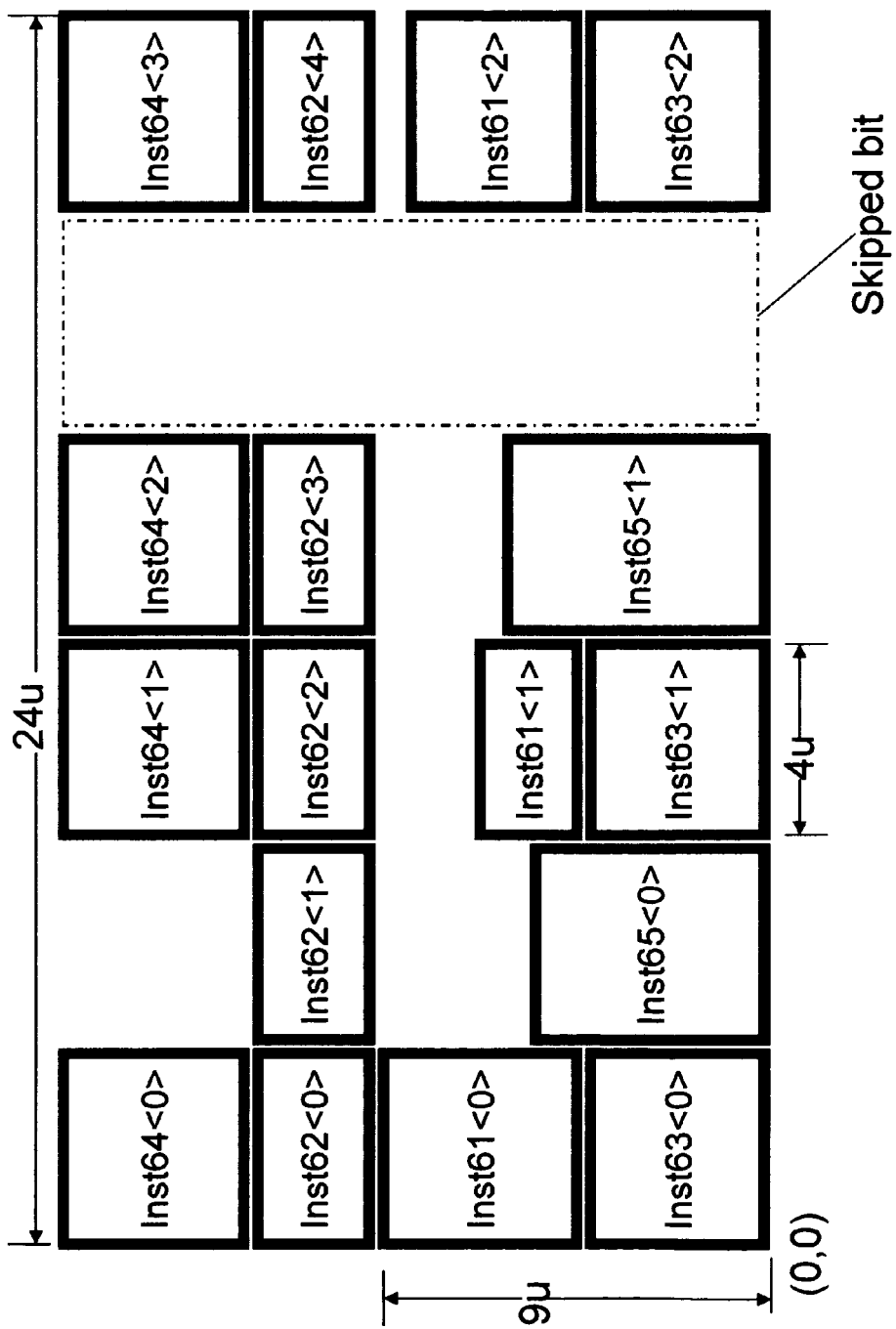
FIG. 6 is a multi bits layout with placed circuits generated according to the tool and method described herein.

FIG. 6 is a representation of a layout with placed circuit elements generated by the tool of our invention as described in the flowchart in FIG. 1. All instances in the same fipBit position are vertically stacked according to their relative fipYlevel. The following parameters were used to generate the placed layout shown in FIG. 6. In this example, all fipPcskip and fipRot parameters are "0" and "R0" respectively and the bit width is 4u.

Tools configuration setting:
    SkipBits: "4"

Instances:
    Inst61<0:2>:
        fipBit: "0 2 . . . "
        fipYlevel: "3"
        fipSnap: on
    Inst62<0:4>:
        fipBit: "0 1 . . . "
        fipYlevel: "5"
        fipSnap: on
    Inst63<0:2>:
        fipBit: "0 2 . . . "
        fipYlevel: "0"
        fipSnap: off
    Inst64<0:3>:
        fipBit: "<*1> 0 <*2> 2 <*1> 5"
        fipYlevel: "10"
        fipSnap: off
    Inst65<0:1>:
        fipBit: "1 3"
        fipYlevel: "0"
        fipSnap: off Inst63<0> is in fipBit 0 and has the lowest fipYlevel of Inst61<0>, Inst62<0>, Inst63<0>, and Inst64<0>. Therefore it is placed at the lowest vertical position. Inst61<0> abuts to the top of Inst63<0> since it has the next lowest fipYlevel. FipYlevels do not have to be adjacent, and only their relative magnitude in relation to other cells in their stack is important. FipYlevel 1 and 10 will still abut if there are no instances in levels 2–9.

For multi-bit arrayed instances, such as Inst65<0 1>, a fipBit value is required for each bit of the array. If Inst65<0: 1> has a fipBit equal to "2 4", Inst65<0> will be placed at bit 2 and Inst65<1> will be placed at bit 4.

Some arrayed instances in this example are placed using patterns. The patterns in our method are keyed by using the ". . . " string within placement parameters. For instance, placing Inst62<0:4> would normally require the fipBit string of "0 1 2 3 5". Instead, we can use the pattern "0 1 . . . ". This pattern will take the difference between the numbers in it and apply it to successive iterations of fipBit. Since the difference between 0 and 1 is 1, the next number will be the difference plus the last number in the series. This pattern will extrapolate as "0 1 2 3 4". The last cell, Inst62<4> is in bit 5, due to the SkipBit defined for bit 4. SkipBit will force any pattern extrapolation to skip a designated list of bit positions. Likewise, Inst63<0:2> has a fipbit of "0 2 . . . " translating to "0 2 4". If a single numerical value is put in for the placement of a multi-bit arrayed instance, sequential placement is assumed, i.e. "0" is the same as "0 1 . . . ".

Inst64<0:3> has a more complex pattern notation. <*X>, where X is an integer, implies that the next X bits will be placed using the pattern immediately following the brackets. In the case of Inst64<0:3>, the first bit will be placed using "0". The next two bits are placed using "2", which implies "2 3 . . . " and the final bit is placed using "5". This makes the final placement for the array "0 2 3 5".

Since Inst61<0:2> has snap enabled, the tallest instance in the array, i.e., Inst61<0>, will set the snap line for fipYlevel 3. In FIG. 6, the snap line is set at Y=9 microns, i.e., sum of the height of Inst63<0> and Inst61<0>, from the origin (0,0) for fipYlevel 3. Since fipSnap is on in Inst62<0:4>, it will conform to snapping rules and be placed no lower than the highest snap line below it. Inst62<0:4> is in fipYlevel 5, so the highest snap line beneath it is the one created in fipYlevel 3 by Inst61<0>. Therefore, all instances in Inst62<0:4> are snapped to the snap line at Y=9 microns. Artificial gaps exist below Inst62<1:4> due to the elevation of the snap line and either smaller or no instance for the fipYlevel right below the snap line.

The invention may be implemented, for example, by having the system for schematic driven placement in custom VLSI circuit design by executing the method as a software application, in a dedicated processor, or in a dedicated processor with dedicated code. The code receives input from a user and/or from data, and executes a sequence of machine-readable instructions, which can also be referred to as code. These instructions may reside in various types of signal-bearing media. In this respect, one aspect of the present invention concerns a program product, comprising a signal-bearing medium or signal-bearing media tangibly embodying a program of machine-readable instructions executable by a digital processing apparatus to perform a method for schematic driven placement in custom VLSI circuit design as a software application.

This signal-bearing medium may comprise, for example, memory in a server. The memory in the server may be non-volatile storage, a data disc, or even memory on a vendor server for downloading to a processor for installation. Alternatively, the instructions may be embodied in a signal-bearing medium such as the optical data storage disc. Alternatively, the instructions may be stored on any of a variety of machine-readable data storage mediums or media, which may include, for example, a "hard drive", a RAID array, a RAMAC, a magnetic data storage diskette (such as a floppy disk), magnetic tape, digital optical tape, RAM, ROM, EPROM, EEPROM, flash memory, magneto-optical storage, paper punch cards, or any other suitable signal-bearing media including transmission media such as digital and/or analog communications links, which may be electrical, optical, and/or wireless. As an example, the machine-readable instructions may comprise software object code, compiled from a language such as "C++", Java, Pascal, ADA, assembler, and the like.

Additionally, the program code may, for example, be compressed, encrypted, or both, and may include executable code, script code and wizards for installation, as in Zip code and cab code. As used herein the term machine-readable instructions or code residing in or on signal-bearing media include all of the above means of delivery.

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

We claim:

1. A method of generating a placed layout comprising steps of:
    a) receiving a user provided schematic with circuit data and placement parameters of circuit elements, and defaults;
    b) receiving a definition of cell physical position in the horizontal direction,
    c) receiving a definition of cell's vertical stacking level for each cell;
    d) receiving a definition of a cell orientation for each cell;
    e) receiving a specification of vertical alignment of multiple cell instances,
    f) receiving a definition of vertical spacing between two adjacent cells;
    g) extrapolating placement positions from a numeric pattern;
    h) reading submacro/leaf cell/gate sizes, PC pitch and bit width information from a design library;
    i) decoding the placement parameters and the definitions and calculating placement positions for all cells; and
    j) generating a layout/hierarchical layout with placed circuit elements.

2. The method of claim 1 further comprising a step of receiving the definitions and parameters from an associated library.

3. A tool for generating placed layout by a method comprising steps of:
    a) receiving a user provided schematic with circuit data and placement parameters for all cells, and defaults;
    b) receiving a definition of cell physical position of each cell in the horizontal direction,
    c) receiving a definition of cell's vertical stacking level for each cell;
    d) receiving a definition of cell orientation for each cell;
    e) receiving a specification of vertical alignment of multiple cell instances,
    f) receiving a definition of vertical spacing between two adjacent cells;
    g) extrapolating placement positions for all cells from a numeric pattern;
    h) reading submacro/leaf cell/gate sizes, PC pitch and bit width information from a design library;
    i) decoding the placement parameters and the definitions and calculating placement positions for all cells; and
    j) generating a layout/hierarchical layout with placed circuit elements.

4. The tool of claim 3 comprising a step of receiving the definitions and parameters from an associated library.

* * * * *